United States Patent
Deban et al.

(10) Patent No.: US 11,848,261 B2
(45) Date of Patent: Dec. 19, 2023

(54) LOW RF CROSSTALK DEVICES VIA A SLOT FOR ISOLATION

(71) Applicant: Ciena Corporation, Hanover, MD (US)

(72) Inventors: Ramin Deban, Côte-Saint-Luc (CA); Jean-Frédéric Gagné, Québec (CA)

(73) Assignee: Ciena Corporation, Hanover, MD (US)

( * ) Notice: Subject to any disclaimer, the term of this patent is extended or adjusted under 35 U.S.C. 154(b) by 231 days.

(21) Appl. No.: 17/494,106

(22) Filed: Oct. 5, 2021

(65) Prior Publication Data

US 2022/0115313 A1    Apr. 14, 2022

Related U.S. Application Data

(60) Provisional application No. 63/089,444, filed on Oct. 8, 2020.

(51) Int. Cl.
*H01L 23/498* (2006.01)
*H01L 23/00* (2006.01)

(52) U.S. Cl.
CPC ........ *H01L 23/49838* (2013.01); *H01L 24/48* (2013.01); *H01L 2224/48227* (2013.01)

(58) Field of Classification Search
CPC ................ H01L 23/49838; H01L 24/48
See application file for complete search history.

(56) References Cited

U.S. PATENT DOCUMENTS

| | | | |
|---|---|---|---|
| 8,759,726 B2 | 6/2014 | Ross et al. | |
| 10,020,249 B2 | 7/2018 | Gagné et al. | |
| 10,328,432 B2 | 6/2019 | Feilders et al. | |
| 2002/0100987 A1* | 8/2002 | Chang | H01L 23/49822 257/781 |
| 2008/0211071 A1* | 9/2008 | Fjelstad | H01L 23/3114 257/676 |
| 2012/0282807 A1* | 11/2012 | Regnier | H01R 13/6466 174/250 |
| 2016/0028162 A1* | 1/2016 | Ou | H01Q 9/0457 343/905 |
| 2018/0286797 A1* | 10/2018 | Goh | H01L 21/486 |
| 2020/0168538 A1* | 5/2020 | Ong | H01L 25/0652 |
| 2020/0294901 A1* | 9/2020 | Strong | H01L 21/481 |
| 2021/0098375 A1* | 4/2021 | Foo | H01L 21/76877 |
| 2021/0144864 A1* | 5/2021 | Pevzner | H05K 3/4679 |

FOREIGN PATENT DOCUMENTS

WO    2015/040500 A2    3/2015

* cited by examiner

*Primary Examiner* — Michael Jung
(74) *Attorney, Agent, or Firm* — Baratta Law PLLC; Lawrence A. Baratta, Jr.

(57) ABSTRACT

An apparatus includes a plurality of layers arranged on top of one another and including at least one ground layer and a signal layer; a first set of signal pads and a second set of signal pads on the signal layer; and a slot formed in the at least one ground layer between the first set of signal pads and the second set of signal pads. The apparatus can include an optical assembly housed by the plurality of layers and connected to the first set of signal pads and the second set of signal pads. The optical assembly can include a micro Intradyne Coherent Receiver (μICR), a Coherent Driver Modulator (CDM), or a Coherent Optical Subassembly (COSA).

18 Claims, 5 Drawing Sheets

Surface current on 1st tungsten layer without any slot

Surface current on 1st tungsten layer with a slot of 300 x 500 um

LOW RF CROSSTALK DEVICES VIA A SLOT FOR ISOLATION

CROSS-REFERENCE TO RELATED APPLICATION(S)

The present disclosure claims priority to U.S. Provisional Patent Application No. 63/089,444, filed Oct. 8, 2020, and entitled "Low RF crosstalk devices via a slot for isolation," the contents of which are incorporated by reference in their entirety.

FIELD OF THE DISCLOSURE

The present disclosure generally relates to Electrical-Optical/Optical-Electrical (EO/OE) circuit design. More particularly, the present disclosure relates to low Radio Frequency (RF) crosstalk devices.

BACKGROUND OF THE DISCLOSURE

In one application, there is a need for high bandwidth EO/OE connections, such as with optical modules including micro Intradyne Coherent Receiver (µICR). For example, a µICR can be 400-800 Gb/s or more, operating at 32-64 Gbaud or more. µICR modules are configured to plug into network element components and include channels for the In-phase (I) and Quadrature (Q) channels, as well as two of each for two-polarizations (e.g., X/Y or Vertical/Horizontal polarizations). There are data link connectors between these modules and the network element components.

In high bandwidth systems, e.g., 100 Gb/s or more such as in networking applications, and more specifically in high frequency EO/OE, various components noise limits the data link performance (i.e., Signal-to-Noise Ratio (SNR)). The noise contributors are numerous, and the present disclosure relates to inter-channel crosstalk. As is appreciated, bandwidth continues to grow and increasing bandwidth brings crosstalk as a new obstacle to good performance of the EO/OE circuits. As is known in the art, crosstalk is any phenomenon by which a signal transmitted on one circuit or channel of a transmission system creates an undesired effect in another circuit or channel. Crosstalk is usually caused by undesired capacitive, inductive, and/or conductive coupling from one circuit or channel to another.

Conventionally, the main solution to achieve less crosstalk is to increase the spacing between the adjacent channels. Another solution is to double the Ground (GND) wirebonds. These conventional techniques are limited because circuits are limited in size. That is, circuit form-factor does not support ever increasing space between the channels beyond a certain limit or the insertion of double wirebonds.

BRIEF SUMMARY OF THE DISCLOSURE

The present disclosure relates to low Radio Frequency (RF) crosstalk devices. As described above, increasing bandwidth brings crosstalk as a new obstacle to good performance of EO/OE circuits. The present disclosure includes cutting one of the propagation mediums of crosstalk to reduce the undesired signal. That is, the present disclosure can include introduction of a slot in a ground plane, such as in a ceramic packet or a Transimpedance Amplifier (TIA). Beneficially, satisfying crosstalk requirements will be more challenging as the bandwidth continues to increase in EO/OE circuits. This technique will reduce crosstalk, require no additional space, and it is not only limited to packages, as an example, it can be implemented in TIA ground plane as well.

In an embodiment, an apparatus includes a plurality of layers arranged on top of one another and including at least one ground layer and a signal layer; a first set of signal pads and a second set of signal pads on the signal layer; and a slot formed in the at least one ground layer between the first set of signal pads and the second set of signal pads.

The apparatus can further include an optical assembly housed by the plurality of layers and connected to the first set of signal pads and the second set of signal pads. The optical assembly can include a second slot in a ground plane, and the second slot is between corresponding connections for the first set of signal pads and connections for the second set of signal pads. The optical assembly can include a micro Intradyne Coherent Receiver (µICR). The optical assembly can include a Coherent Driver Modulator (CDM). The optical assembly can include a Coherent Optical Subassembly (COSA).

The apparatus can further include a second ground layer on an opposite side of the at least ground layer from the signal layer. The second ground layer has no slot formed therein. The slot can have a width of at least 100 µm. The slot can have a width of at least 300 µm. The slot can have a width of at least 500 µm. The at least one ground layer can include tungsten. In another embodiment, a method can include providing the apparatus.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, the present disclosure relates to low Radio Frequency (RF) crosstalk devices. As described above, increasing bandwidth brings crosstalk as a new obstacle to good performance of EO/OE circuits. The present disclosure includes cutting one of the propagation mediums of crosstalk to reduce the undesired signal. That is, the present disclosure can include introduction of a slot in a ground plane, such as in a ceramic package or a Transimpedance Amplifier (TIA). Beneficially, satisfying crosstalk requirements will be more challenging as the bandwidth continues to increase in EO/OE circuits. This technique will reduce crosstalk, require no additional space, and it is not only limited to packages, as an example, it can be implemented in TIA, CDM, and/or COSA ground planes as well.

Figure 1:
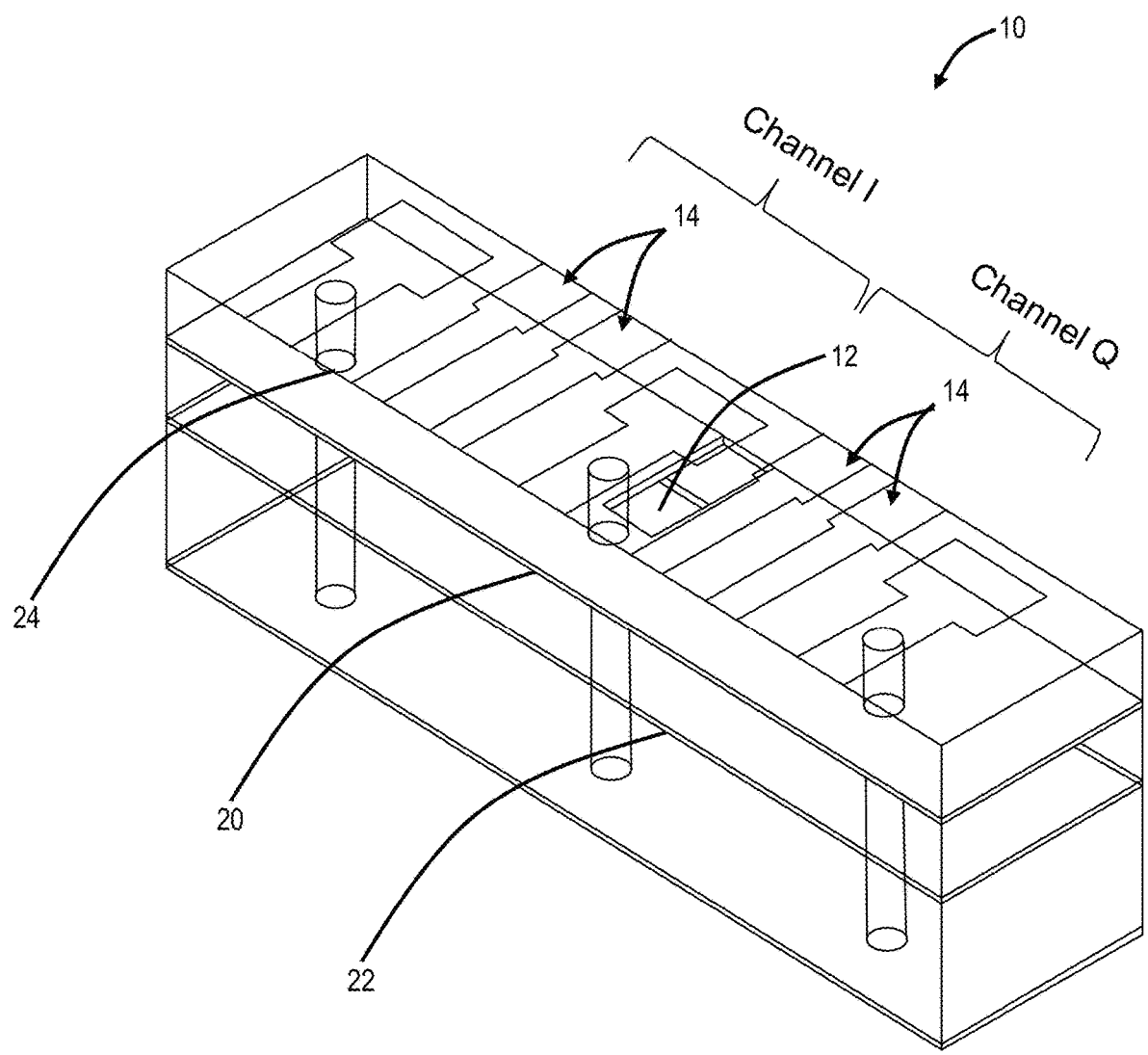
FIG. 1 is a diagram of a ceramic package with a slot included therein for isolating crosstalk.
Figure 2:
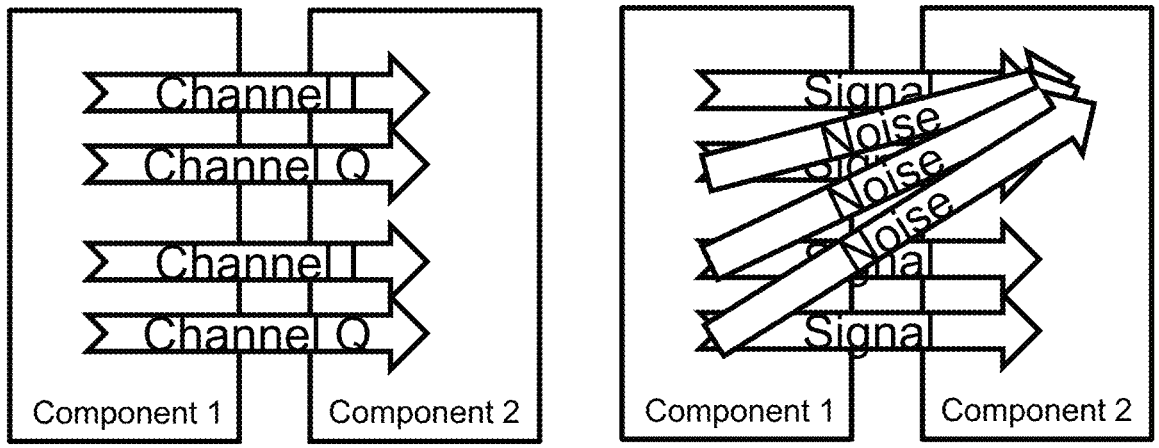
FIG. 2 is a diagram of an example illustrating the sources of the undesired signals into the first channel which is considered as noise. The reduction of these undesired signals from adjacent channels is what this disclosure addresses.
Figure 2:
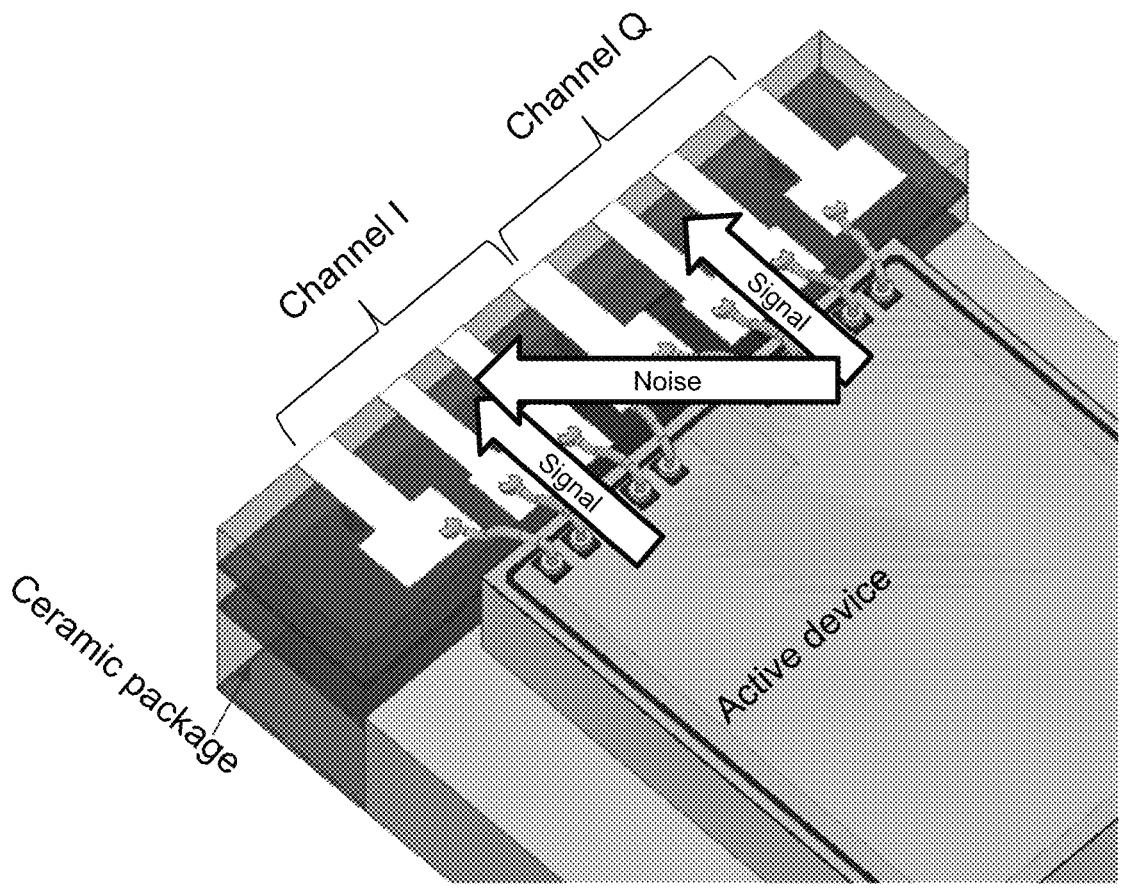
Figure 3:
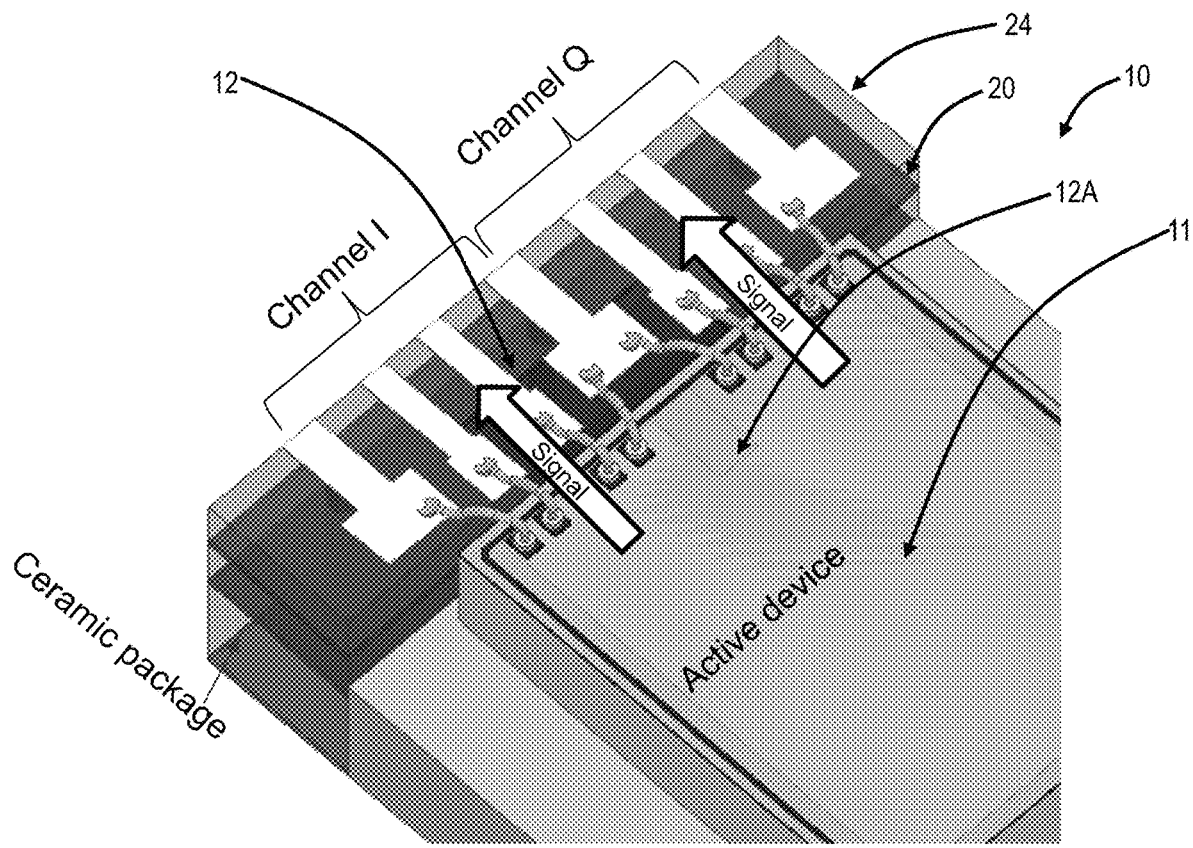
FIG. 3 is a diagram of the example of FIG. 2 illustrating the slot for improving the SNR, via better inter-channel isolation (reduced crosstalk).
Figure 3:
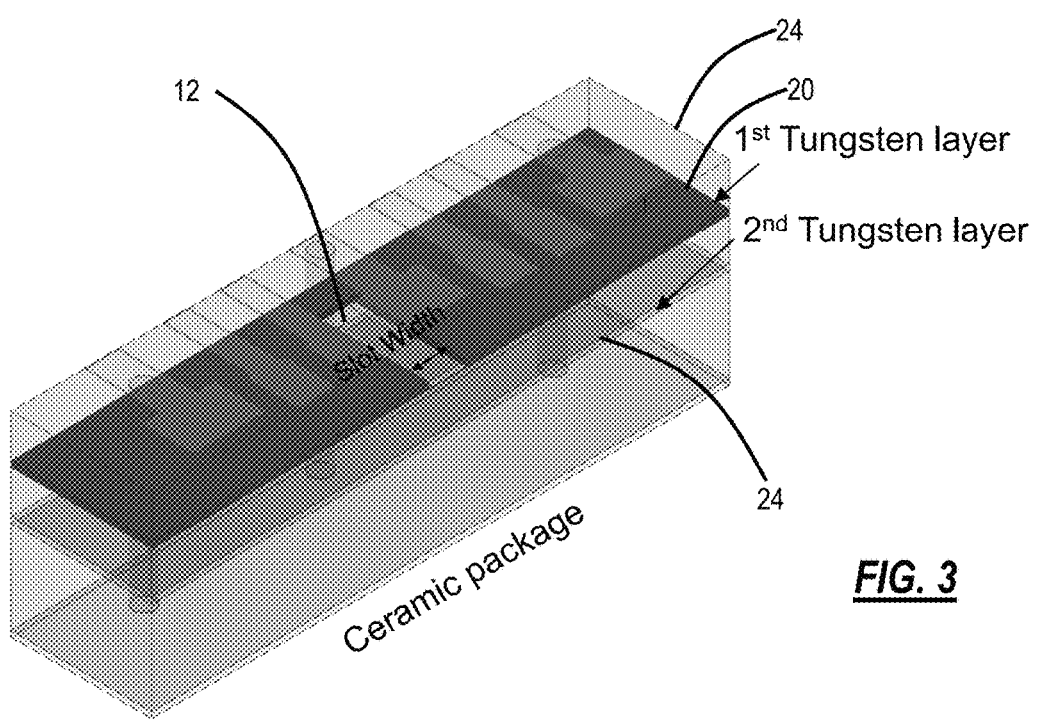
Figure 4A:
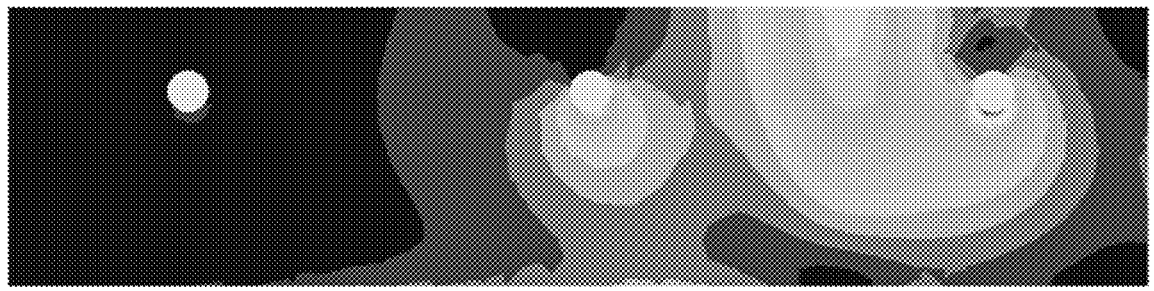
FIGS. 4A and 4B are diagrams of surface current on the first tungsten layer without a slot (FIG. 4A) and with the slot (FIG. 4B).
Figure 4B:
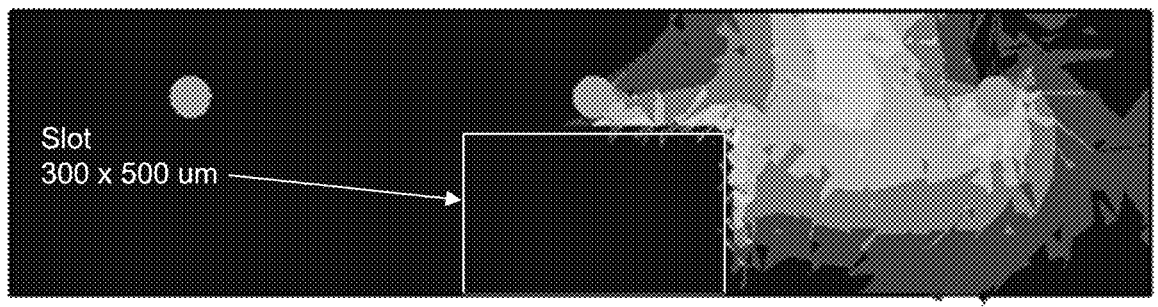

FIG. 1 is a diagram of a ceramic package 10 showing only two channels with a slot 12 included between the channels. FIG. 2 is a diagram of an example illustrating the SNR degradation solely from a bandwidth increase, demonstrating the need for better inter-channel isolation (reduced crosstalk) which is what this disclosure addresses. FIG. 3 is a diagram of the example of FIG. 2 illustrating the slot 12 for improving the SNR, via better inter-channel isolation (reduced crosstalk). FIGS. 4A and 4B are diagrams of surface current on the first tungsten layer without a slot (FIG. 4A) and with the slot 12 (FIG. 4B).

While shown here as a high bandwidth µICR, those skilled in the art will recognize the slot 12 can be used in any package EO/OE module, including COSA, CDM, and the like. The ceramic package 10 is used to house an optical assembly 11 that includes optics, electronics, and the like including channels.

For example, the µICR can comply with OIF-DPC-MRX-02.0—Implementation Agreement for Integrated Dual Polarization Micro-Intradyne Coherent Receivers (June 2017), the contents of which are incorporated by reference. The CDM can comply to OIFHBCDM02.0—Implementation Agreement for High Bandwidth Coherent Driver Modulator (July 2021), the contents of which are incorporated by reference. The COSA can comply to OIF-IC-TROSA-01.0—Implementation Agreement for Integrated Coherent Transmit-Receive Optical Sub Assembly (August 2019), the contents of which are incorporated by reference. Of course, the present disclosure contemplates other types of optical assemblies as well.

Referring to FIG. 1, the ceramic package 10 includes differential lines 14 to transmit the signal of each channel, and at least a first ground layer 20, a second ground layer 22, and a signal layer 24. The ground layers 20, 22 can include tungsten as well as other ground materials. The signal layer 24 can include any material. This approach described herein is agnostic of the material technology and is rather based on the geometry, field distribution.

The slot 12 is utilized in the ceramic package 10 to reduce the crosstalk. The slot 12 can be added in the first ground layer 20 of the ceramic package 10. By introducing the slot 12 in the first ground layer 20, the inter-channel crosstalk is improved. As described herein, the channels can include an In-phase (I) channel and a Quadrature (Q) channel, with the slot 12 in-between.

This technique can be applied to a micro Intradyne Coherent Receiver (µICR), Coherent Driver Modulator (CDM), Coherent Optical Subassembly (COSA) and other ceramic packages. Also, the package can be any other material and not just ceramic.

For a µICR, it can also be applied to the ground plane of an active device such as a TIA at an input and output level to reduce even more the crosstalk between adjacent channels.

Referring to FIG. 2, the effect of inter-channel crosstalk has been exacerbated over the past years when system bandwidth increased rapidly by 40% and this trend will continue even more with 5G. There is a specific concern with 'integrated noise' over the system bandwidth. The below example illustrates the SNR degradation from solely bandwidth increase and demonstrate the need for better inter-channel isolation (reduced crosstalk) which is what this innovation brings.

$$SNR = 20*\log10\left(\frac{\int_{f_l}^{f_h} Signal \cdot df}{\int_{f_l}^{f_h} Noise \cdot df}\right)$$

| SNR Calculated Over 30 GHz (dB) | SNR Calculated Over 50 GHz (dB) | SNR Calculated Over 70 GHz (dB) |
|---|---|---|
| 58.5 | 52 | 44 |

As can be seen from the example of FIG. 2, SNR suffers more than 6 dB degradation by increasing the bandwidth from 30 to 50 GHz.

Referring to FIG. 3, the slot 12 is between the I Channel and the Q Channel providing isolation between the channels. Based on simulation, the slot 12 in the first tungsten layer providing crosstalk mitigation of about 3 dB.

Other shapes of slots than the rectangular one showed in FIGS. 1, 3 & 4 will produce different crosstalk isolation. The bigger size of the slot, either on the ceramic package or on the TIA side, provides better inter-channel isolation resulting in improved SNR. However, the shape and size of the slots will be dictated by the fabrication design rules of ceramic package or the TIA design rules and constraints.

For example, there can be a second slot 12A (FIG. 3) in a ground plane on the optical assembly 11.

Referring to FIGS. 4A and 4B, the surface current is shown on the first tungsten layer without a slot (FIG. 4A) and with the slot 12 (FIG. 4B). The following table illustrates performance based on different slot widths.

| Slot Width (µm) | SNR Calculated Over 30 GHz (dB) | SNR Calculated Over 50 GHz (dB) | SNR Calculated Over 70 GHz (dB) |
|---|---|---|---|
| No Slot | 58.5 | 52 | 44 |
| 100 | 59.5 | 53 | 45 |
| 300 | 60.5 | 54 | 46 |
| 500 | 61 | 54.5 | 47 (note 1) |

Also, note (1)—simulation shows that applying another opening on the ground plane of the active device (TIA) the SNR can be further improved by 2.5 dB.

In an embodiment, an apparatus 10 includes a plurality of layers 20, 22, 24 arranged on top of one another and including at least one ground layer 20 and a signal layer 24; a first set of signal pads 14 and a second set of signal pads 14 on the signal layer 24; and a slot 12 formed in the at least one ground layer 20 between the first set of signal pads 14 and the second set of signal pads 14.

The apparatus can further include an optical assembly 11 housed by the plurality of layers and connected to the first set of signal pads and the second set of signal pads. The optical assembly 11 can include a second slot 12A in a ground plane, and the second slot is between corresponding connections for the first set of signal pads and connections for the second set of signal pads. The optical assembly 11 can include a micro Intradyne Coherent Receiver (µICR). The optical assembly 11 can include a Coherent Driver Modulator (CDM). The optical assembly 11 can include a Coherent Optical Subassembly (COSA).

The apparatus can further include a second ground layer on an opposite side of the at least ground layer from the signal layer. The second ground layer has no slot formed therein. The slot can have a width of at least 100 µm. The slot can have a width of at least 300 µm. The slot can have a width of at least 500 µm. The at least one ground layer can include tungsten. In another embodiment, a method can include providing the apparatus.

Figure 5:
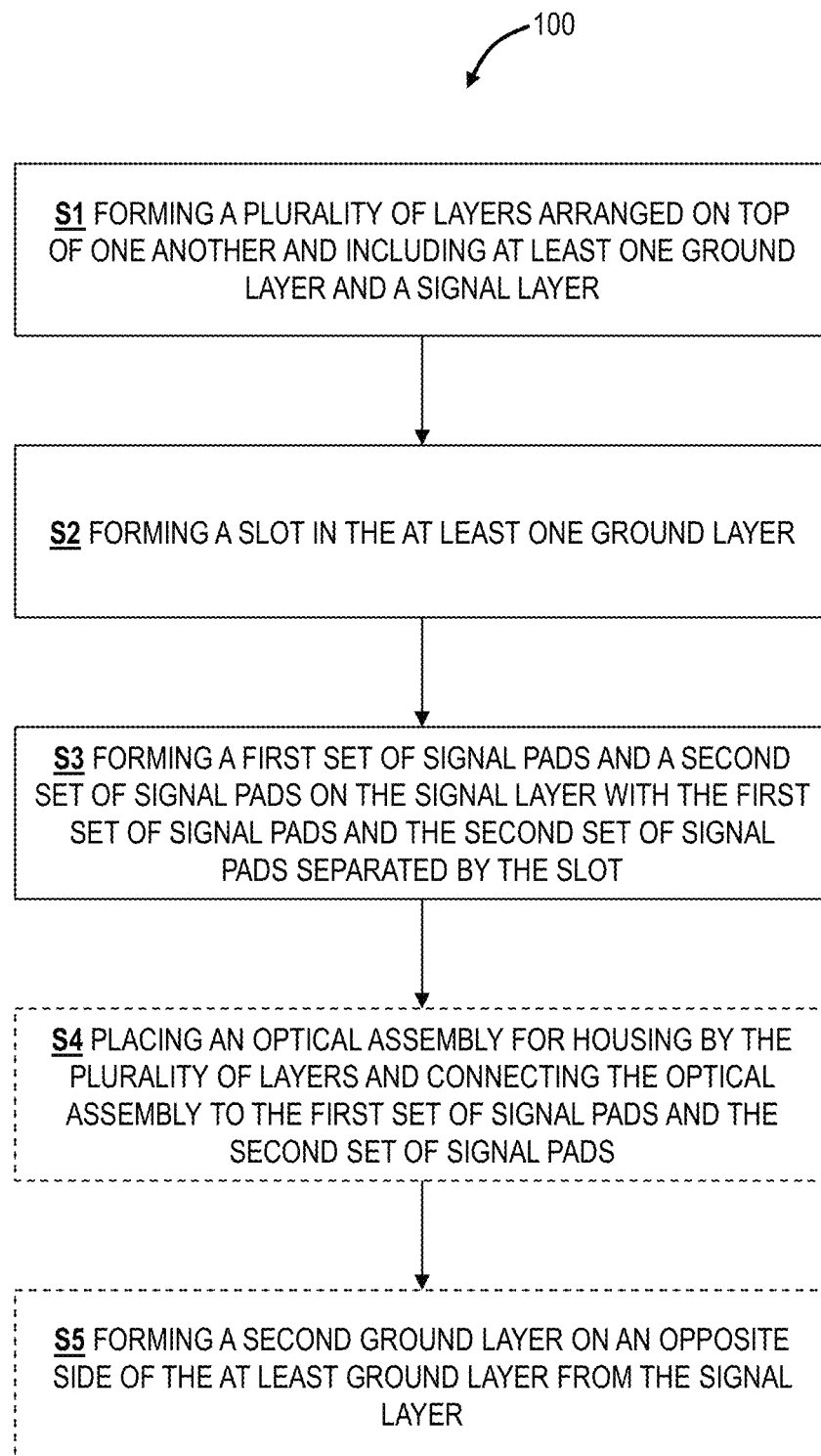
FIG. 5 is a flowchart of a process for forming an apparatus with the slot described herein.

FIG. 5 is a flowchart of a process 100 for forming an apparatus with the slot 12 described herein. The process 100 includes forming a plurality of layers arranged on top of one another and including at least one ground layer and a signal layer (step S1).

The process 100 further includes forming a slot in the at least one ground layer (step S2).

The process 100 further includes forming a first set of signal pads and a second set of signal pads on the signal layer with the first set of signal pads and the second set of signal pads separated by the slot (step S3).

The process 100 can further include placing an optical assembly housed for housing by the plurality of layers and connected connecting the optical assembly to the first set of signal pads and the second set of signal pads (step S4). The optical assembly can include a micro Intradyne Coherent Receiver (µICR), a Coherent Driver Modulator (CDM), or a Coherent Optical Subassembly (COSA).

The process 100 can further include forming a second ground layer on an opposite side of the at least ground layer from the signal layer (step S5). The second ground layer can have no slot formed therein.

It will be appreciated that some embodiments described herein including the optical assembly may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments. In particular, high-speed circuitry is configured to create the I channel and the Q channel.

Moreover, some embodiments may include a non-transitory computer-readable medium having instructions stored thereon for programming a computer, server, appliance, device, processor, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. An apparatus comprising:
   a plurality of layers arranged on top of one another and including at least one ground layer and a signal layer;
   a first set of signal pads and a second set of signal pads on the signal layer;
   a slot formed in the at least one ground layer between the first set of signal pads and the second set of signal pads; and
   an optical assembly housed by the plurality of layers and connected to the first set of signal pads and the second set of signal pads.

2. The apparatus of claim 1, wherein the optical assembly includes a second slot in a ground plane, and the second slot is between corresponding connections for the first set of signal pads and connections for the second set of signal pads.

3. The apparatus of claim 1, wherein the optical assembly includes a micro Intradyne Coherent Receiver (ACR).

4. The apparatus of claim 1, wherein the optical assembly includes a Coherent Driver Modulator (CDM).

5. The apparatus of claim 1, wherein the optical assembly includes a Coherent Optical Subassembly (COSA).

6. The apparatus of claim 1, further comprising a second ground layer on an opposite side of the at least ground layer from the signal layer.

7. The apparatus of claim 6, wherein the second ground layer has no slot formed therein.

8. The apparatus of claim 1, wherein the slot has a width of at least 100 µm.

9. The apparatus of claim 1, wherein the slot has a width of at least 300 µm.

10. The apparatus of claim 1, wherein the slot has a width of at least 500 µm.

11. The apparatus of claim 1, wherein the at least one ground layer includes tungsten.

12. The apparatus of claim 1, wherein the first set of signal pads are for an in-phase signal and the second set of signal pads are for a quadrature signal.

13. An optical apparatus formed by a process comprising steps of:
   forming a plurality of layers arranged on top of one another and including at least one ground layer and a signal layer;
   forming a slot in the at least one ground layer;
   forming a first set of signal pads and a second set of signal pads on the signal layer with the first set of signal pads and the second set of signal pads separated by the slot; and placing an optical assembly for housing by the plurality of layers and connecting the optical assembly to the first set of signal pads and the second set of signal pads.

14. The optical apparatus of claim 13, wherein the optical assembly includes a micro Intradyne Coherent Receiver (ACR).

15. The optical apparatus of claim 13, wherein the optical assembly includes a Coherent Driver Modulator (CDM).

16. The optical apparatus of claim 13, wherein the optical assembly includes a Coherent Optical Subassembly (COSA).

17. The optical apparatus of claim 13, wherein the steps further include forming a second ground layer on an opposite side of the at least ground layer from the signal layer.

18. The optical apparatus of claim 17, wherein the second ground layer has no slot formed therein.

* * * * *